(12) United States Patent
Ichijo et al.

(10) Patent No.: US 8,958,225 B2
(45) Date of Patent: Feb. 17, 2015

(54) ELECTRIC POWER CONVERTER

(71) Applicant: Denso Corporation, Kariya, Aichi-pref. (JP)

(72) Inventors: Hiromi Ichijo, Chiryu (JP); Shoji Sakai, Toyota (JP)

(73) Assignee: Denso Corporation, Kariya (JP)

( * ) Notice: Subject to any disclaimer, the term of this patent is extended or adjusted under 35 U.S.C. 154(b) by 73 days.

(21) Appl. No.: 13/932,110

(22) Filed: Jul. 1, 2013

(65) Prior Publication Data
US 2014/0003111 A1    Jan. 2, 2014

(30) Foreign Application Priority Data

Jul. 2, 2012    (JP) ................................. 2012-148645

(51) Int. Cl.
| | | |
|---|---|---|
| H02M 1/00 | (2006.01) | |
| H01L 23/473 | (2006.01) | |
| H01L 23/40 | (2006.01) | |
| H01L 25/11 | (2006.01) | |
| H02M 7/00 | (2006.01) | |

(52) U.S. Cl.
CPC .............. *H02M 1/00* (2013.01); *H01L 23/473* (2013.01); *H01L 23/4006* (2013.01); *H01L 25/117* (2013.01); *H02M 7/003* (2013.01); *H01L 2924/0002* (2013.01)
USPC ........................................................ 363/141

(58) Field of Classification Search
USPC .......... 363/141, 144; 361/624, 676, 704, 688, 361/715, 763
See application file for complete search history.

(56) References Cited

U.S. PATENT DOCUMENTS

| | | | | |
|---|---|---|---|---|
| 5,373,279 | A  * | 12/1994 | Ozawa et al. | .................... 338/21 |
| 6,713,687 | B2 * | 3/2004 | Yazaki et al. | ................. 174/263 |
| 6,758,876 | B2 * | 7/2004 | Suzuki et al. | ................ 55/385.6 |
| 7,561,429 | B2 * | 7/2009 | Yahata et al. | ................. 361/715 |
| 7,580,270 | B2 * | 8/2009 | Iikubo et al. | .................. 361/818 |
| 7,742,303 | B2 * | 6/2010 | Azuma et al. | ................. 361/699 |

(Continued)

FOREIGN PATENT DOCUMENTS

| | | |
|---|---|---|
| JP | 2008-125240 | 5/2008 |
| JP | 2009-59887 | 3/2009 |

(Continued)

OTHER PUBLICATIONS

Office Action (2 pgs.) dated Apr. 18, 2014 issued in corresponding Japanese Application No. 2012-148645 with an at least partial English-language translation thereof (3 pgs.).

*Primary Examiner* — Adolf Berhane
(74) *Attorney, Agent, or Firm* — Nixon & Vanderhye PC (57) ABSTRACT

An electric power converter has a semiconductor module that has a switching element therein, cooling pipes that contact with heat radiating surfaces of the semiconductor module and cool the semiconductor module, and a capacitor module formed by sealing a capacitor element therein by a potting material. A piled unit is formed by piling the semiconductor module and the cooling pipes. A direction in which the semiconductor module and the cooling pipes are piled is defined as a piling direction. The piled unit is sandwiched between the capacitor module disposed in a first end side in the piling direction of the piled unit and a pressing member disposed in a second end side in the piling direction of the piled unit. The first end of the piled unit is contacted to a potting surface that is a surface of the potting material in the capacitor module.

10 Claims, 11 Drawing Sheets

(56) References Cited

U.S. PATENT DOCUMENTS

| | | | |
|---|---|---|---|
| 7,952,876 B2* | 5/2011 | Azuma et al. | 361/699 |
| 8,355,244 B2* | 1/2013 | Kimura et al. | 361/676 |
| 8,654,509 B2* | 2/2014 | Ishimoto et al. | 361/503 |
| 2004/0070959 A1* | 4/2004 | Sakai | 361/792 |
| 2008/0112201 A1 | 5/2008 | Yahata et al. | |
| 2009/0231811 A1* | 9/2009 | Tokuyama et al. | 361/699 |
| 2010/0259898 A1 | 10/2010 | Kimura et al. | |
| 2011/0299265 A1* | 12/2011 | Nakatsu et al. | 361/820 |
| 2011/0310585 A1* | 12/2011 | Suwa et al. | 361/820 |
| 2013/0294040 A1* | 11/2013 | Fukumasu et al. | 361/752 |
| 2014/0003111 A1* | 1/2014 | Ichijo et al. | 363/141 |

FOREIGN PATENT DOCUMENTS

| | | |
|---|---|---|
| JP | 2010-252461 | 11/2010 |
| JP | 2011-103728 | 5/2011 |
| JP | 2012-44828 | 3/2012 |

* cited by examiner

ELECTRIC POWER CONVERTER

CROSS-REFERENCE TO RELATED APPLICATION

The application is based on and claims the benefit of priority from earlier Japanese Patent Application No. 2012-148645 filed Jul. 2, 2012, the description of that is incorporated herein by reference.

TECHNICAL FIELD

The present disclosure relates to an electric power converter that has a semiconductor module, a capacitor module, and a cooling pipes.

BACKGROUND

There exists an electric power converter with a semiconductor module that has a switching element therein, and a cooling pipe that cools the semiconductor module as the electric power converter installed in an electric vehicle, a hybrid car, etc., for example.

In the electric power converter, a structure of disposing a flat spring member that urges a piled unit of the semiconductor module and the cooler together in the piling direction is proposed (refer to Japanese Patent Application Laid-Open Publication No. 2011-103728, for example).

Thereby, while fully securing a contact pressure between the semiconductor module and the cooling pipes, a dimensional tolerance of the piled unit in the piling direction can be absorbed by the flat spring member.

Moreover, a change of the contact pressure caused by a dimensional change of the piled unit accompanying a temperature change is prevented by providing the flat spring member.

However, providing the flat spring member as mentioned above will cause an increase in a number of parts, and will cause problems such as enlargement of the electric power converter, and an increase in manufacturing steps.

Moreover, in order to absorb the dimensional tolerance and thermal expansion of the piled unit by the flat spring member as mentioned above, a spring constant of the flat spring member needs to be below a predetermined value, and it is necessary to enlarge the size of the flat spring member in a pressurizing direction.

As a result, there is a possibility that the electric power converter becomes large.

On the other hand, if the thickness of the flat spring member is simply made small in order to make the spring constant small, the strength of the flat spring member will be reduced.

SUMMARY

An embodiment provides an electric power converter that enables a miniaturization and reduction of the number of manufacturing steps by reducing the number of parts required.

In an electric power converter according to a first aspect, the electric power converter has a semiconductor module that has a switching element therein, cooling pipes that contact with heat radiating surfaces of the semiconductor module and cool the semiconductor module, and a capacitor module formed by sealing a capacitor element therein by a potting material.

A piled unit is formed by piling the semiconductor module and the cooling pipes. A direction where the semiconductor module and the cooling pipes are piled is defined as a piling direction. The piled unit is sandwiched between the capacitor module disposed in a first end side in the piling direction of the piled unit and a pressing member disposed in a second end side in the piling direction of the piled unit.

The first end of the piled unit is contacted to a potting surface that is a surface of the potting material in the capacitor module.

In the electric power converter mentioned above, the first end of the piled unit is contacted to the potting surface of the capacitor module.

Since the potting material may have a certain degree of elasticity, the piled unit that is contacting to the potting surface can be held in the condition where it is pressed by the pressing member toward the potting surface.

Thereby, a predetermined pressurizing force is applied to the piled unit by the reaction from the potting surface.

Moreover, a structure where the piled unit is sandwiched by predetermined pressurizing force in the piling direction is realizable.

Further, this structure is realizable according to a spatial relationship between the piled unit and the capacitor module.

That is, it is not necessary to provide a flat spring member etc. in order to apply pressurizing force to the piled unit.

Therefore, the number of parts of the electric power converter can be reduced.

As a result, the miniaturization of the electric power converter 1 and reduction of manufacturing steps become possible.

Moreover, although it is also possible to give elasticity to the pressing member, since the elastic force in the both of the potting surface and the pressing member are combined in series in this case, it is easy to make the spring constant as a whole small.

Therefore, it becomes easy to absorb a dimensional tolerance and thermal expansion of the piled unit.

As a result, it is not necessary to enlarge the size of the pressing member in the piling direction, and is easy to realize miniaturization of the electric power converter, and simplification.

As mentioned above, according to the present disclosure, the electric power converter that enables a miniaturization and reduction of manufacturing steps by reducing number of parts can be provided.

The semiconductor module and the cooling pipes may be contacted directly, or may be contacted via insulating materials etc. that have thermal conductivity.

Moreover, the potting material may be constituted by an epoxy resin, silicone resin, etc., for example.

In the electric power converter according to a second aspect, a press-contacted surface with the pressing member and a press-contacted surface with the potting surface of the piled unit overlap with the switching element in the piling direction.

In the electric power converter according to a third aspect, the semiconductor module has a plurality of switching elements therein. The plurality of switching elements overlaps with the press-contacted surface with the pressing member of the piled unit in the piling direction. The plurality of switching elements also overlaps with the press-contacted surface with the potting surface of the piled unit in the piling direction.

In the electric power converter according to a fourth aspect, the plurality of switching elements is arranged along a direction that intersects perpendicularly with the piling direction.

In the electric power converter according to a fifth aspect, wherein, the semiconductor module has heat radiating surfaces on a pair of principal surfaces, and the cooling pipes are arranged to contact onto both sides of the heat radiating surfaces.

In the electric power converter according to a sixth aspect, each of the cooling pipes has a coolant channel therein where cooling media circulates, and signal terminals and power terminals disposed in the semiconductor module are projected in a direction that intersects perpendicularly with both a circulating direction of the cooling medium and the piling direction of the cooling pipes.

In the electric power converter according to a seventh aspect, a control circuit board having a control circuit that controls the conductor module is disposed next to the pressing member in a side opposite to the piled unit such that a normal direction of a principal surface of the control circuit board matches the piling direction.

The signal terminals disposed in the semiconductor module are connected to the control circuit board, and the signal terminals are disposed inside the capacitor module and the control circuit board when seen from the piling direction.

In the electric power converter according to an eighth aspect, the pressing member is fixed to the capacitor module.

In the electric power converter according to a ninth aspect, the capacitor module has a guiding section that positions the piled unit in a direction that intersects perpendicularly to the piling direction.

In the electric power converter according to a tenth aspect, an elastic member is disposed in the pressing member where at least a portion of the pressing member that contacts to the piled unit.

DETAILED DESCRIPTION OF THE PREFERRED EMBODIMENTS

First Embodiment

With reference to FIG. 1 to FIG. 6, hereinafter will be described an embodiment of the present disclosure.

An electric power converter 1 of the present embodiment has a semiconductor module 2, cooling pipes 3, and a capacitor module 4, as shown in FIG. 1 to FIG. 4.

The semiconductor module 2 has switching elements 21 therein. The cooling pipes 3 contact with heat radiating surfaces 24 of the semiconductor module 2, and cool the semiconductor module 2. The capacitor module 4 is formed by sealing a capacitor element 41 therein by a potting material 42.

Figure 1:
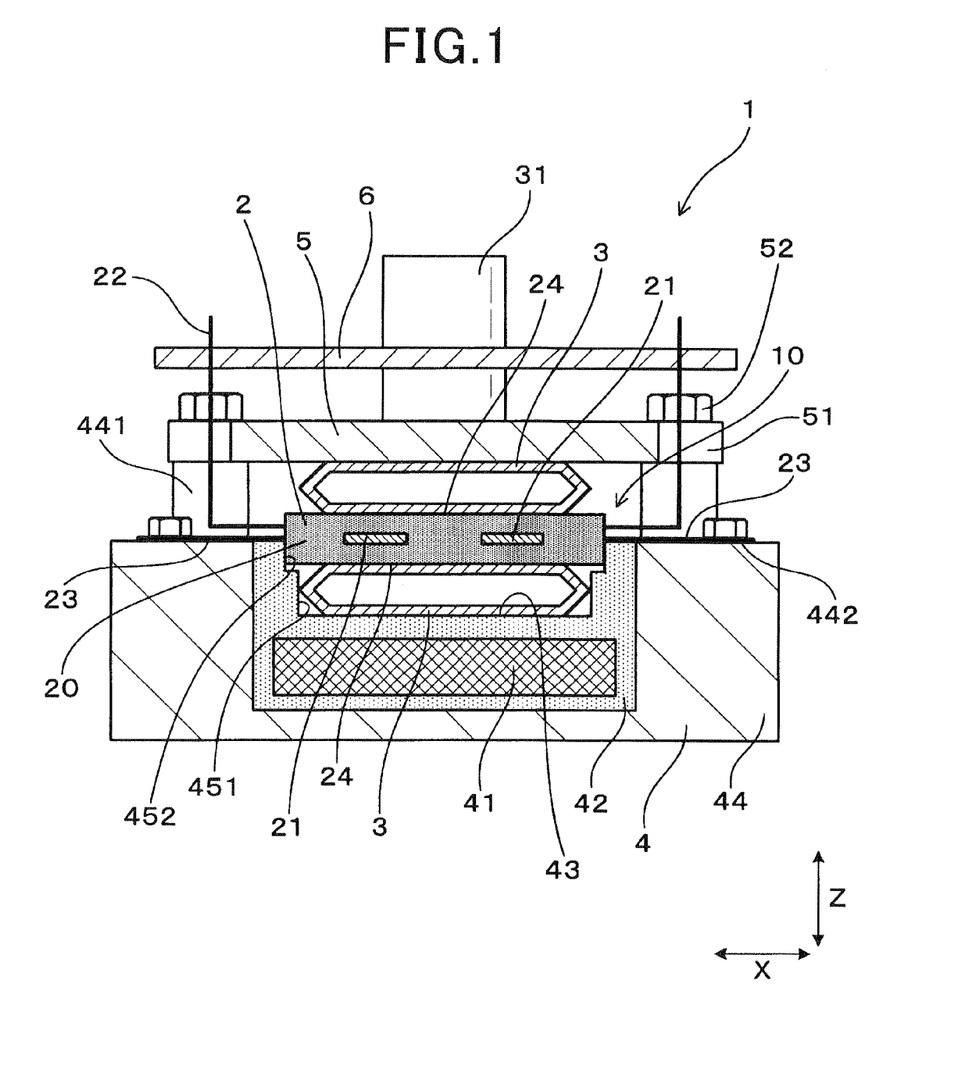
FIG. 1 shows a sectional view of an electric power converter in a first embodiment.
Figure 4:
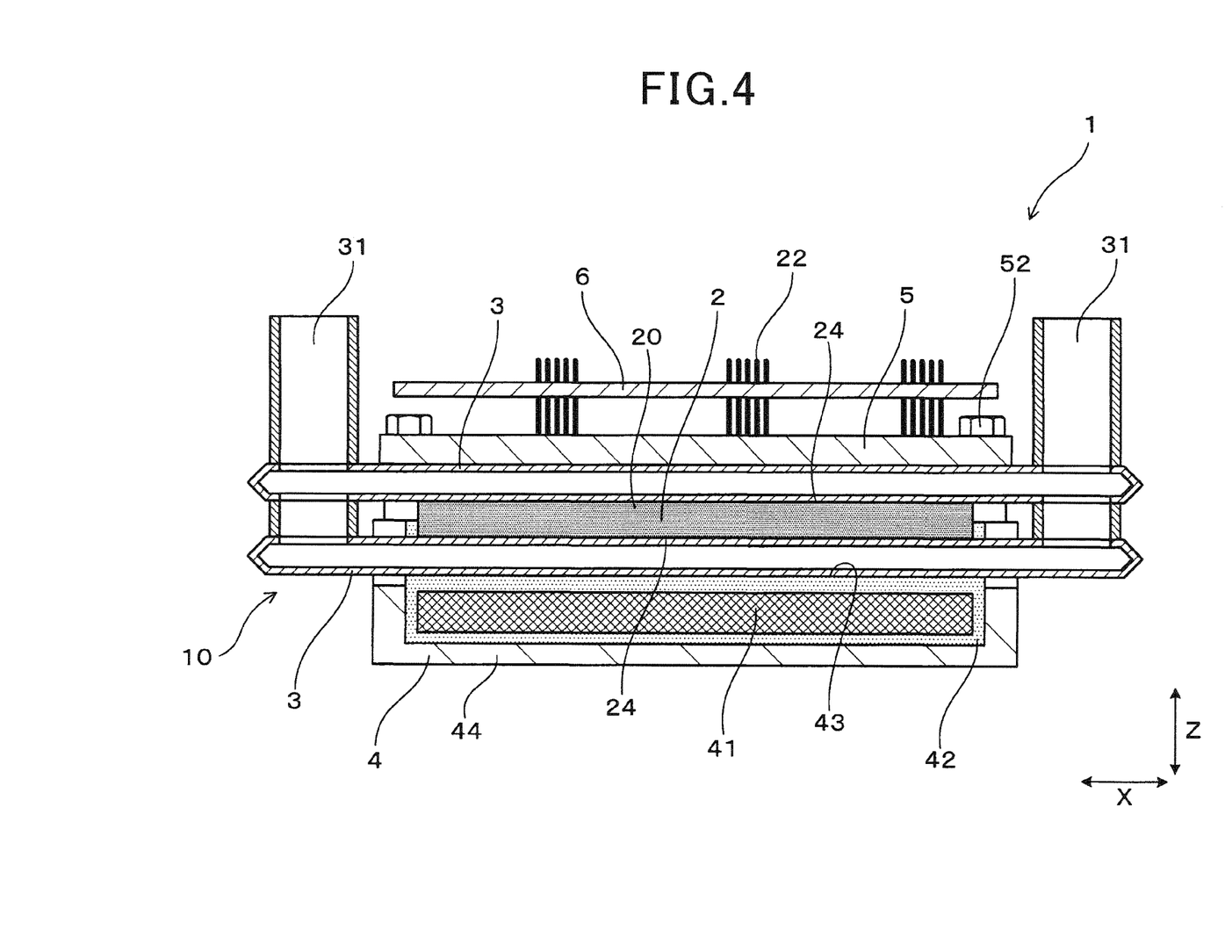
FIG. 4 is a sectional view of the electric power converter in the first embodiment taken along a line IV-IV of FIG. 3.

As shown in FIG. 1 and FIG. 4, a piled unit 10 is formed by piling the semiconductor module 2 and the cooling pipes 3. Here, a direction where the semiconductor module 2 and the cooling pipes 3 are piled is defined as a piling direction Z. The piled unit 10 is sandwiched between the capacitor module 4 disposed in a first end side in the piling direction Z of the piled unit 10 and a pressing member 5 disposed in a second end side in the piling direction Z of the piled unit 10.

The first end of the piled unit 10 is contacted to a potting surface 43 that is a surface of the potting material 42 in the capacitor module 4.

Figure 5:
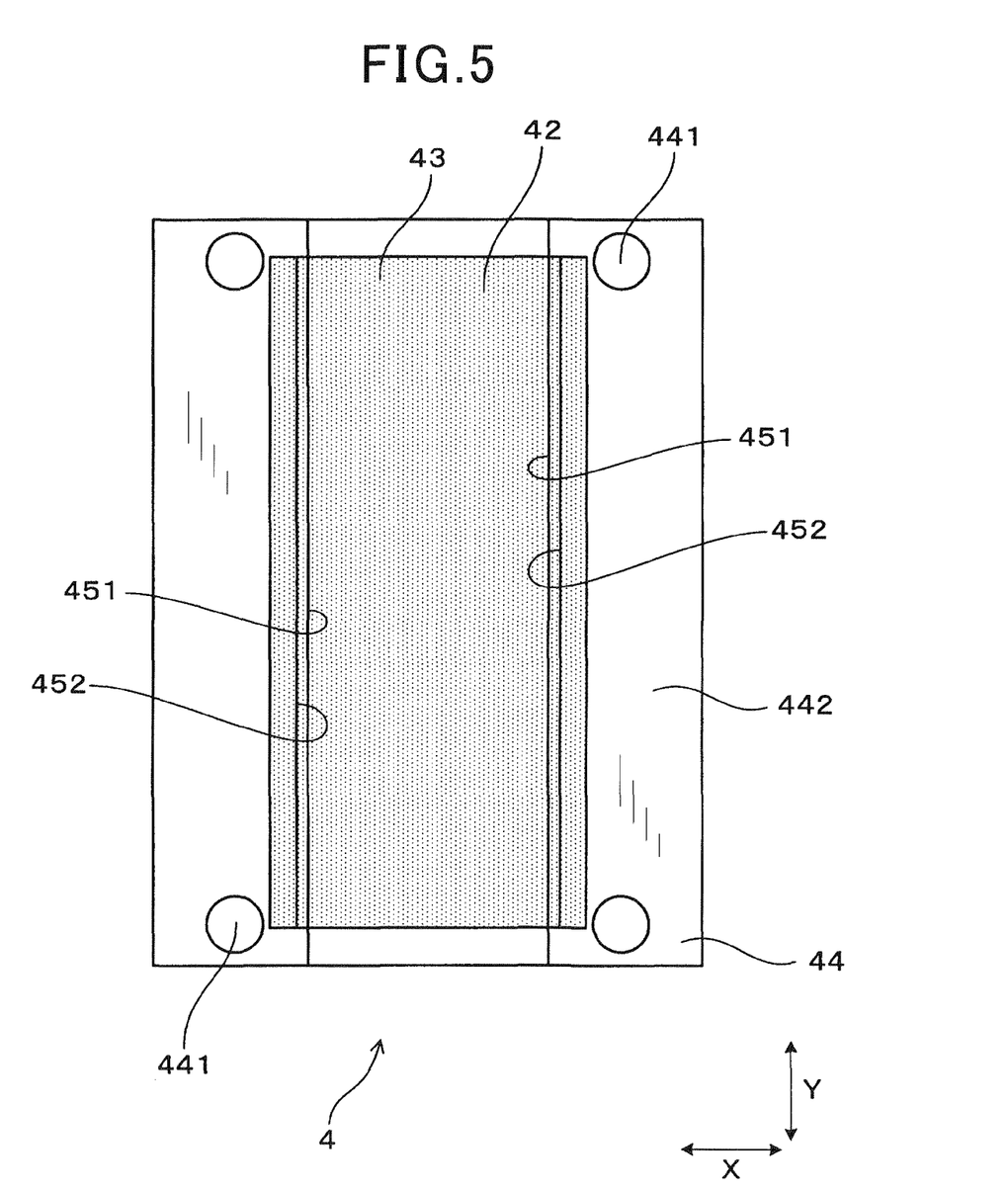
FIG. 5 shows a plan view of the capacitor module in the first embodiment.

In the present embodiment, as shown in FIG. 1, FIG. 4, and FIG. 5, the capacitor module 4 is formed by accommodating the capacitor element 41 and the potting material 42 that seals the capacitor element 41 in a case 44. The case 44 may be made of metal, such as aluminum, for example.

In addition, the flat potting surface 43 is exposed to an opening of the case 44. The first end of the piled unit 10 is contacting with the putting surface 43. The potting material 42 is made of epoxy resins, and has elasticity.

As shown in FIG. 1 and FIG. 4, the piled unit 10 is formed by the semiconductor module 2 and a pair of cooling pipes 3 piled on both principal surfaces of the semiconductor module 2.

That is, the semiconductor module 2 has the heat radiating surfaces 24 on a pair of principal surfaces, and the cooling pipes 3 are arranged to contact onto both sides of the heat radiating surfaces 24.

Each of the cooling pipes 3 is formed by metal, such as aluminum, and has a coolant channel therein where cooling media, such as water, circulates.

Each of the cooling pipes 3 is formed along a direction, hereafter defined as a longitudinal direction Y that intersects perpendicularly to the piling direction Z and the coolant channel is formed so that the cooling medium may flow in the longitudinal direction Y.

In addition, as shown in FIG. 4, the pair of cooling pipes 3 arranged in parallel are connected to each other near both ends in the longitudinal direction Y of the cooling pipes 3.

Moreover, a pair of coolant inlet/outlet pipes 31 for introducing and discharging the cooling medium is connected near both ends of the cooling pipes 3.

The cooling pipes 3 have a width extending in a width direction X that intersects perpendicularly with the piling direction Z and the longitudinal direction Y, and the cooling pipes 3 have shapes such that width in the width direction X is longer than thickness in the piling direction Z.

The cooling pipe 3 disposed on the first end side the piling direction Z of the piled unit 10 is press-contacted to the potting surface 43 of the capacitor module 4.

Moreover, the cooling pipe 3 disposed on the second end side the piling direction Z of the piled unit 10 is press-contacted to the pressing member 5.

The pressing member 5 is made of a metal plate, for example, and has sufficient rigidity.

In addition, the pressing member 5 is fixed to the capacitor module 4.

Figure 6:
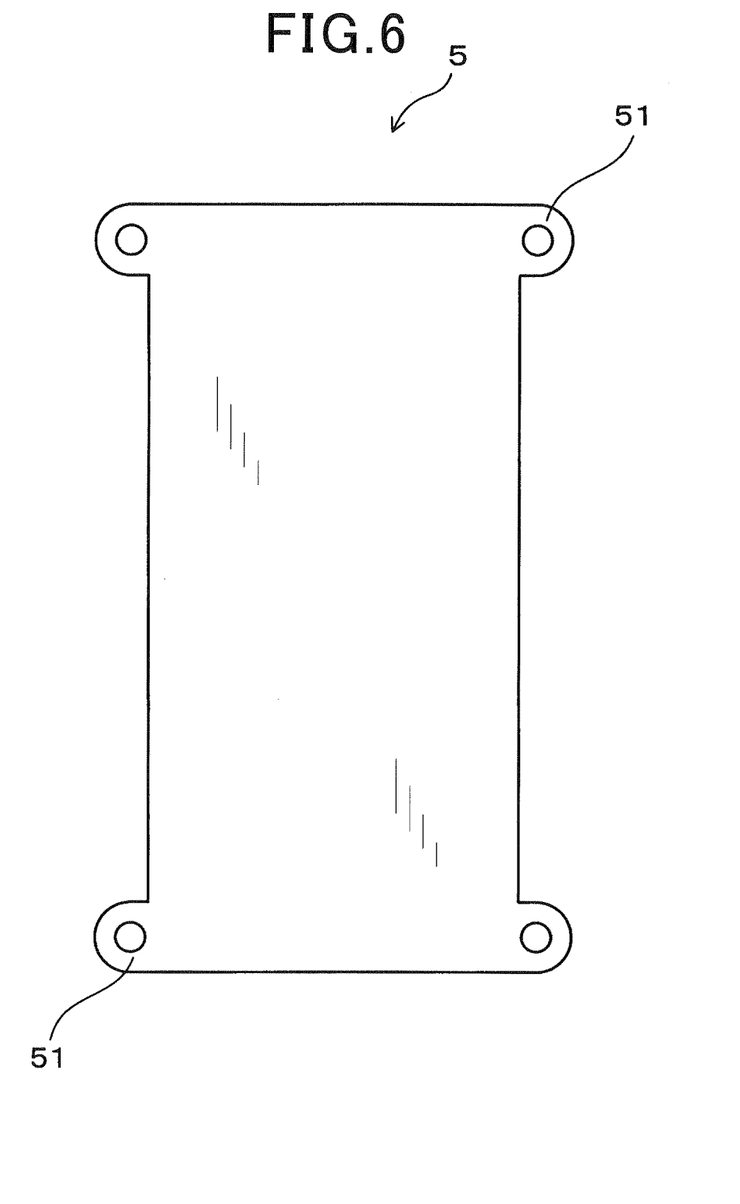
FIG. 6 shows a plan view of the pressing member in the first embodiment.

That is, the pressing member 5 has flange portions 51 disposed in four corners as shown in FIG. 6, and the pressing member 5 is fixed to bosses 441 formed on the case 44 of the capacitor module 4 by bolts 52 through the flange portions 51, as shown in FIG. 1 to FIG. 4.

By this, the piled unit 10 made of the semiconductor module 2 and the pair of cooling pipes 3 is in a condition of being sandwiched by the capacitor module 4 and the pressing member 5.

Moreover, in this condition, the potting material 42 of the capacitor module 4 is elastically compressed.

Thereby, the piled unit 10 receives a predetermined pressurizing force in a direction compressed in the piling direction Z as a reaction from the potting surface 43.

A press-contacted surface with the pressing member 5 and a press-contacted surface with the potting surface 43 of the piled unit 10 overlap with the switching element 21 in the piling direction Z.

The semiconductor module 2 has a plurality of switching elements 21 therein, and the plurality of switching elements 21 overlap with the press-contacted surface with the pressing member 5 and the press-contacted surface with the potting surface 43 of the piled unit 10 in the piling direction Z.

Figure 2:
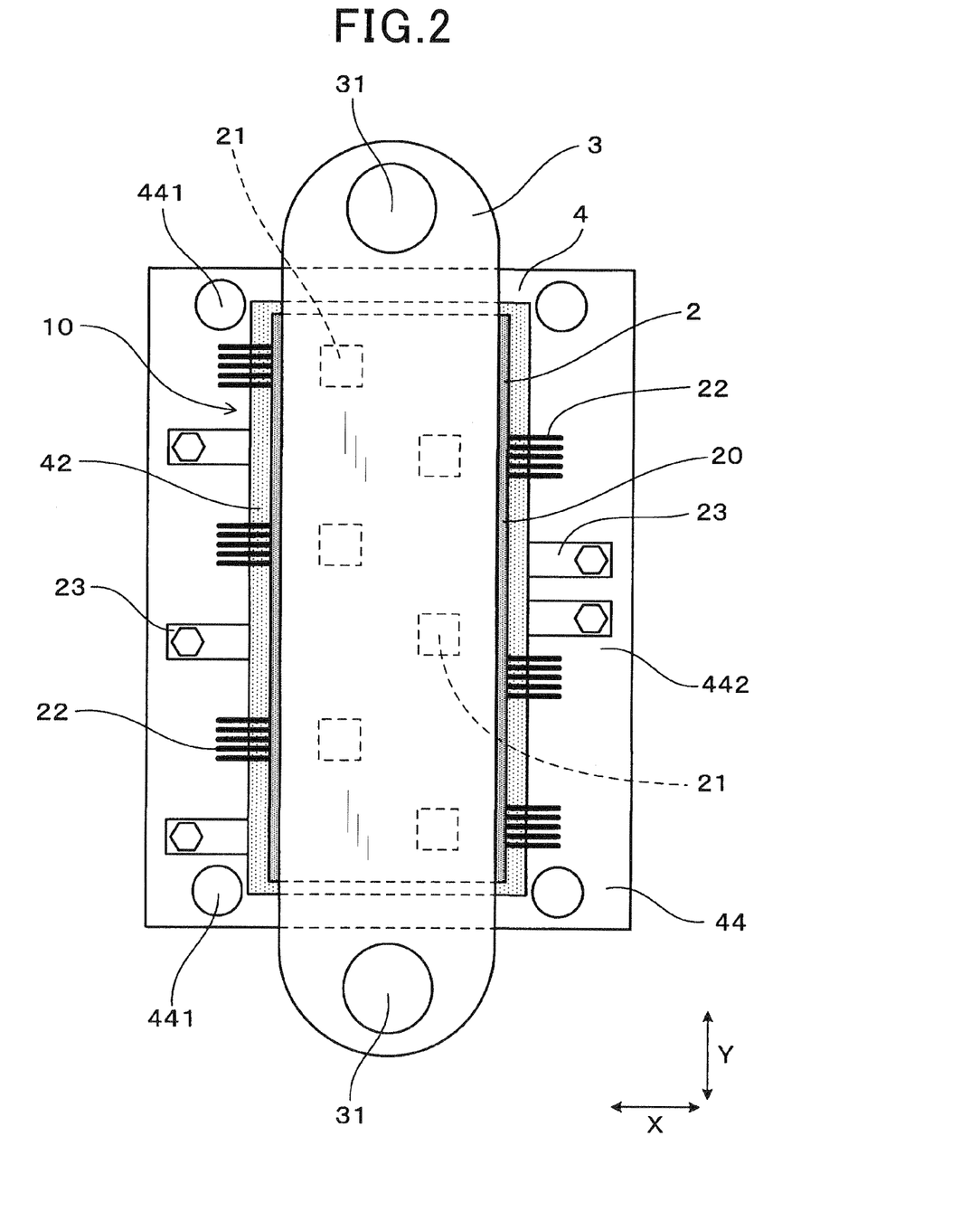
FIG. 2 shows a plan view of the electric power converter in a condition before attaching a pressing member in the first embodiment.

As shown in FIG. 1 and FIG. 2, the plurality of switching elements 21 is arranged along a direction that intersects perpendicularly with the piling direction Z.

In the present embodiment, six switching elements 21 that constitute an inverter circuit are integrated and built in the semiconductor module 2.

The electric power converter 1 may be installed in an electric vehicle, a hybrid car, etc., for example, and can be used as an inverter that can convert direct-current electric power of a direct-current power supply into alternating-current electric power so that a three-phase alternating current motor can be driven.

The six switching elements 21 that constitute this inverter circuit are built in the single semiconductor module 2 in the present embodiment.

In addition, IGBT, MOSFET, etc. can be used as the switching element 21, for example.

Moreover, a plurality of signal terminals 22 and power terminals 23 are projected from a main portion 20 of the semiconductor module 2 where the switching elements 21 are sealed.

The signal terminals 22 and the power terminals 23 are projected in the width direction X of the cooling pipes 3.

Moreover, as shown in FIG. 1 and FIG. 4, the electric power converter 1 has a control circuit board 6 having a control circuit that controls the conductor module 2.

The control circuit board 6 is disposed to a side of the pressing member 5 opposite to the piled unit 10 under the condition where a normal direction of a principal surface of the control circuit board 6 matches the piling direction Z.

The signal terminals 22 disposed on the semiconductor module 2 are connected to the control circuit board 6.

That is, the signal terminals 22 first project from the main portion 20 of the semiconductor module 2 in the width direction X, then bend to a direction opposite to the capacitor module 4 and extends in the piling direction Z.

In addition, the signal terminals 22 extend in the piling direction Z so that they pass through the side of the pressing member 5, and are connected to the control circuit board 6.

The signal terminals 22 are disposed inside the capacitor module 4 and the control circuit board 6 when seen from the piling direction Z.

That is, the signal terminals 22 are positioned inside outer edges of the capacitor module 4 and the control circuit board 6 without protruding from the outer edges in the width direction X.

Moreover, as shown in FIG. 1 and FIG. 2, the power terminals 23 also project from the main portion 20 of the semiconductor module 2 in the width direction X.

However, the power terminals 23 extend in the width direction X without being bent, and parts near tips of the power terminals 23 are fixed to a terminal box 442 disposed in the case 44 of the capacitor module 4.

The power terminals 23 are connected with terminals (not shown) of the capacitor module 4, or terminals of a motor (not shown) in the terminal box 442.

In addition, if the case 44 is made of a conductor, such as metal, an insulator is intervened between the power terminals 23 and the case 44 suitably, and electric insulation between the both is secured.

Moreover, the capacitor module 4 has first and second guiding sections 451 and 452 that position the piled unit 10 in a direction that intersects perpendicularly to the piling direction Z, as shown in FIG. 1 and FIG. 5.

In the present embodiment, the capacitor module 4 has the first guiding section 451 that guides the piled unit 10 by the cooling pipe 3 that contacts to the potting surface 43, and the second guiding section 452 that guides the piled unit 10 by the semiconductor module 2.

That is, two steps of level-difference-parts are disposed in the both sides in the width direction X of the potting surface 43 at the potting material 42 of the capacitor module 4.

A side surface of the first level-difference-part becomes the first guiding section 451 that positions the condenser tube 3 in the width direction X, and a side surface of the second level-difference-part becomes the second guiding section 452 that positions the semiconductor module 2 in the width direction X.

Moreover, in the present embodiment, although the first and second guiding sections 451 and 452 position the parts in the width direction X, they do not have the function of positioning the parts in the longitudinal direction Y.

Figure 3:
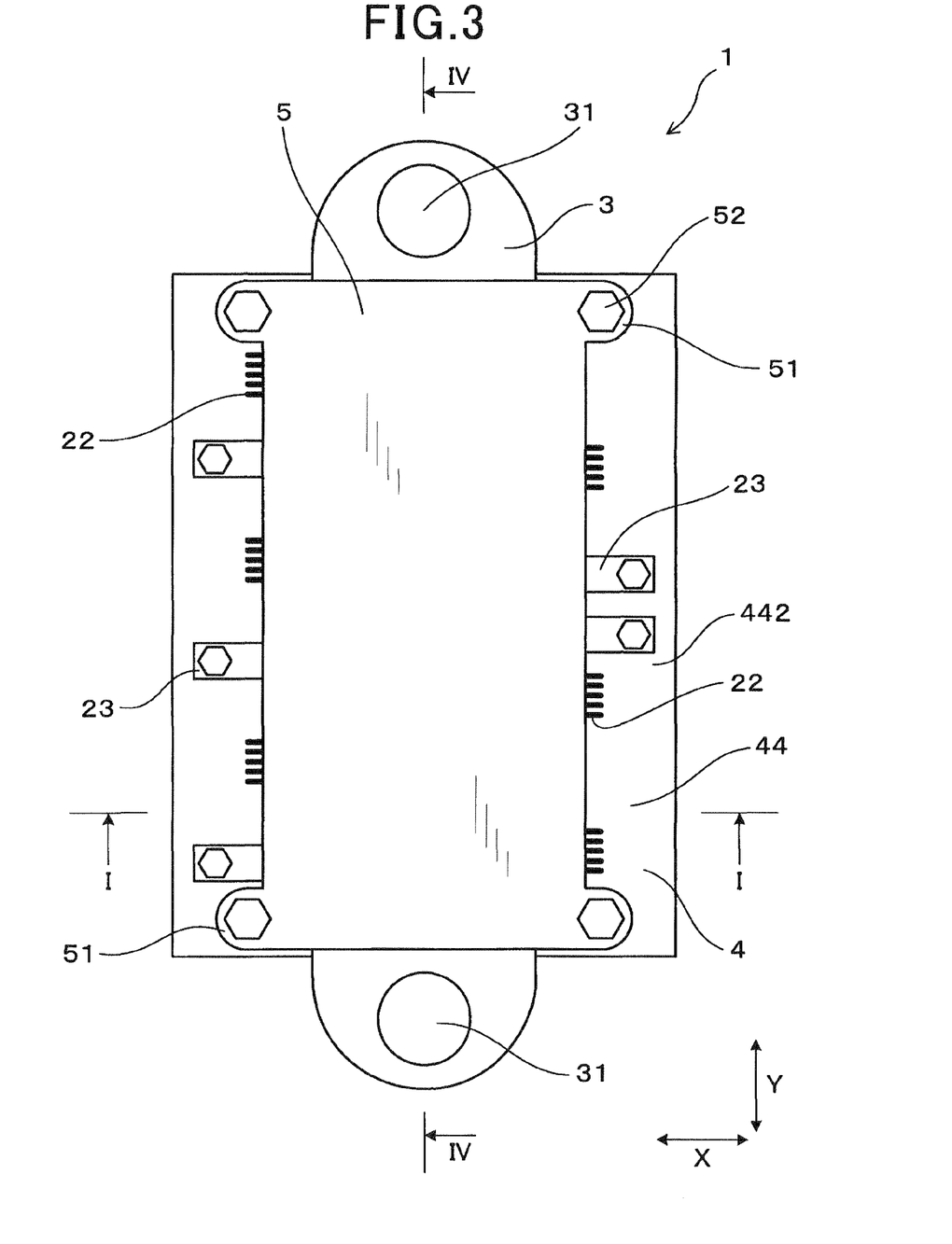
FIG. 3 shows a plan view of the electric power converter in the first embodiment without a control circuit board, and a section taken along a line I-I is equivalent to FIG. 1.

In the present embodiment, as shown in FIG. 2 to FIG. 4, the cooling pipes 3 are formed so as to extend outside both ends of the capacitor module 4 in the longitudinal direction Y.

In connection with this, as shown in FIG. 5, the first and second guiding sections 451 and 452 are formed continuously along the whole capacitor module 4 in the longitudinal direction Y.

However, the guide parts that position the capacitor module 4 may also be composed so that the capacitor module 4 can also be positioned in the longitudinal direction Y.

Moreover, in the present embodiment, although the first and second guiding sections 451 and 452 are formed in the potting material 42, they can also be formed in the case 44.

Next, functions and effects of the present embodiment is explained.

In the electric power converter 1, the first end of the piled unit 10 is contacted to the potting surface 43 of the capacitor module 4.

Since the potting material 42 may have a certain degree of elasticity, the piled unit 10 that is contacting to the potting surface 43 is held in the condition where it is pressed by the pressing member 5 toward the potting surface 43.

Thereby, a predetermined pressurizing force is applied to the piled unit 10 by the reaction from the potting surface 43.

As a result, a structure where the piled unit 10 is sandwiched by predetermined pressurizing force in the piling direction Z is realizable.

In addition, this structure is realizable according to a spatial relationship between the piled unit 10 and the capacitor module 4.

That is, it is not necessary to provide a flat spring member etc. in order to apply pressurizing force to the piled unit 10.

Therefore, the number of parts of the electric power converter 1 can be reduced.

As a result, the miniaturization of the electric power converter 1 and reduction of manufacturing steps become possible.

Moreover, the press-contacted surface with the pressing member 5 and the press-contacted surface with the potting surface 43 of the piled unit 10 overlap with the switching element 21 in the piling direction Z.

In a portion that overlaps with the switching element 21 when seen from the piling direction Z, the switching element 21 can be cooled efficiently since contacting pressure of the press-contacted surfaces can be made high.

Moreover, the plurality of switching elements 21 of the semiconductor module 2 are overlapped with the press-contacted surface of the pressing member 5 of the piled unit 10, and with the press-contacted surface of the potting surface 43 in the piling direction Z.

Thereby, the plurality of switching elements 21 can be cooled efficiently.

Moreover, since the plurality of switching elements 21 can be integrated, the number of manufacturing steps of the electric power converter 1 can be reduce, and the electric power converter 1 can be much more miniaturized.

Further, since the plurality of switching elements 21 is arranged along the direction that intersects perpendicularly with the piling direction Z, each one of the plurality of switching elements 21 can be cooled efficiently.

Furthermore, since the cooling pipes 3 are arranged to contact onto both sides of the pair of heat radiating surfaces 24 in the semiconductor module 2, the semiconductor module 2 can be efficiently cooled from both sides.

Moreover, the signal terminals 22 and the power terminals 23 disposed in the semiconductor module 2 are projected in the direction that intersects perpendicularly with both the circulating direction of the cooling medium (the longitudinal direction Y) and the piling direction Z in the cooling pipes 3 (i.e., width direction X).

Thereby, it becomes easy to constitute the piled unit 10 compactly and easy to realize the miniaturization of the electric power converter 1.

Moreover, the control circuit board 6 is disposed to the side of the pressing member 5 opposite to the piled unit under the condition where a normal direction of the principal surface of the control circuit board 6 matches the piling direction Z.

Further, the signal terminals 22 of the semiconductor module 2 connected to the control circuit board 6 are disposed inside the capacitor module 4 and the control circuit board 6 when seen from the piling direction Z.

Therefore, it is easy to realize the miniaturization of the electric power converter 1 including the control circuit board 6.

Moreover, since the pressing member 5 is fixed to the capacitor module 4, the number of parts of the electric power converter 1 can be reduced.

Moreover, the capacitor module 4 has the first and second guiding sections 451 and 452 that position the piled unit 10 in the direction that intersects perpendicularly to the piling direction Z (i.e., width direction X).

Thereby, a contacting condition of the capacitor module 4 and the piled unit 10 can be realized stably.

As a result, the pressurizing force that acts on the piled unit 10 can be acquired stably.

Moreover, the electric power converter 1 can be assembled easily.

As mentioned above, according to the present embodiment, by reducing the number of parts, the electric power converter can be offered that enables the miniaturization and the reduction of manufacturing steps.

It should be appreciated that, in the second embodiment and the subsequent embodiments, components identical with or similar to those in the first embodiment are given the same reference numerals, and structures and features thereof will not be described in order to avoid redundant explanation.

Second Embodiment

Figure 7:
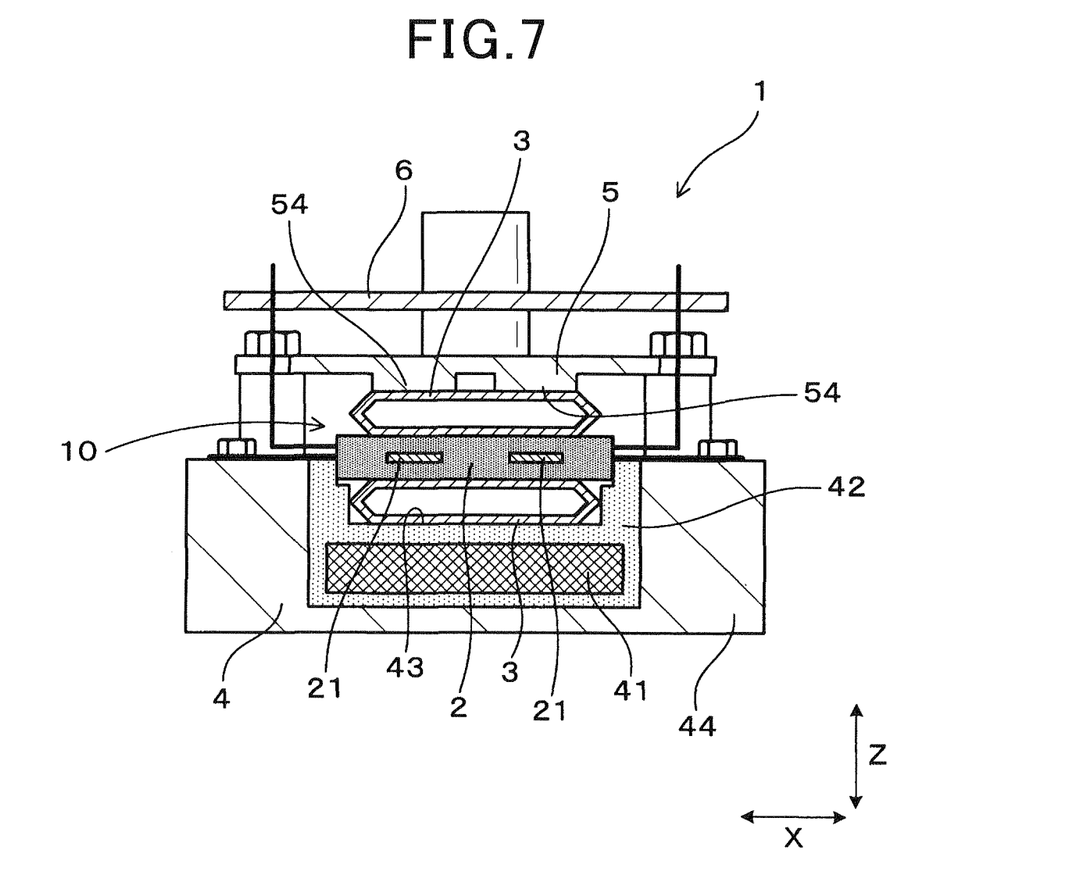
FIG. 7 shows a sectional view of an electric power converter in a second embodiment.
Figure 8:
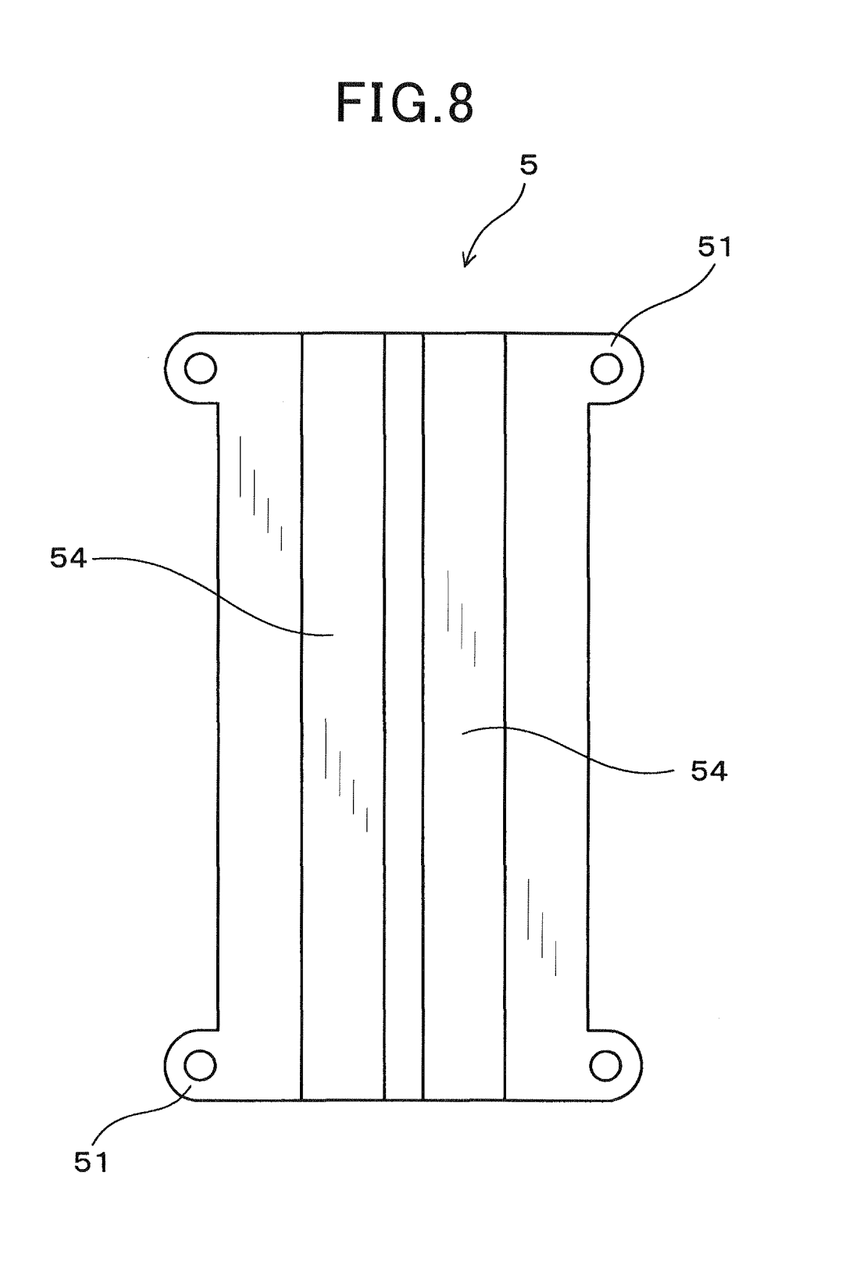
FIG. 8 shows a plan view of a pressing member seen from a side that becomes a piled unit side in the second embodiment.

The present embodiment is an example that formed projecting portions 54 projected to the semiconductor module 2 side to the pressing member 5, as shown in FIG. 7 and FIG. 8.

That is, in the present embodiment, the two projecting portions 54 are disposed on a surface that faces the semiconductor module 2 in the pressing member 5 so as to correspond to the arrangement of the switching element 21.

The semiconductor module 2 provides two rows in the width direction X of sequences of the switching element 21 disposed in a line in the longitudinal direction Y, as shown in FIG. 2.

In addition, as shown in FIG. 8, the projecting portions 54 are formed in the longitudinal direction Y so as to correspond to the arrangement of the two rows of the switching element 21.

The projecting portions 54 are formed in a position that overlaps with the switching element 21 built in the semiconductor module 2 when seen from the piling direction Z.

Moreover, surfaces that contact the semiconductor module 2 in the projecting portion 54 are made flat.

The rest of the composition is the same as that of the first embodiment.

In the present embodiment, in the positions where the switching elements 21 in the semiconductor module 2 are arranged, the piled unit 10 can be pressed reliably by the projecting portions 54 of the pressing member 5.

Therefore, it becomes easy to cool the switching element 21 more effectively.

Other functions and effects are the same as those of the first embodiment.

Third Embodiment

Figure 9:
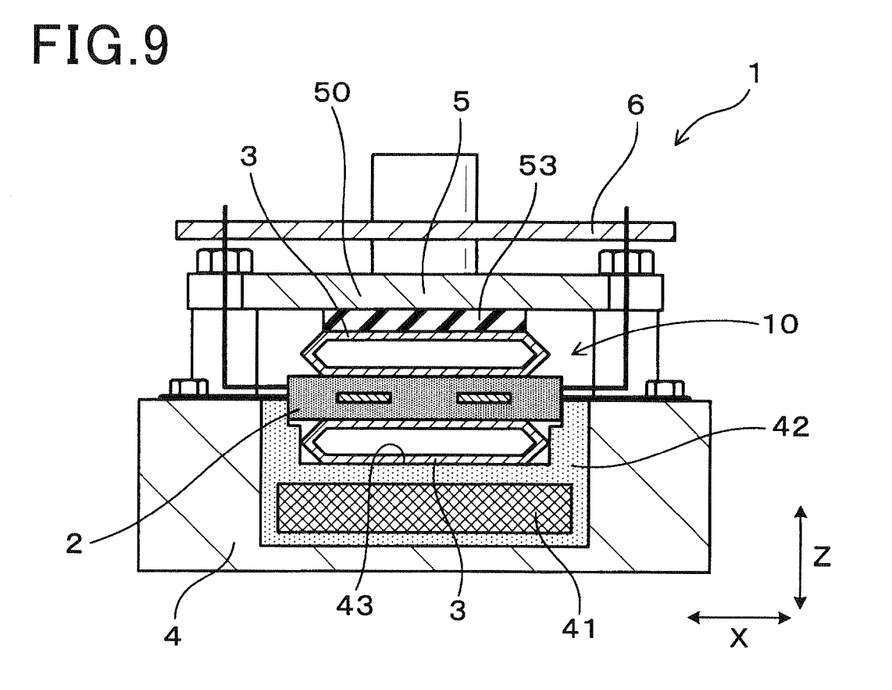
FIG. 9 shows a sectional view of an electric power converter in a third embodiment.

The present embodiment is an example that disposes an elastic member 53 in the pressing member 5 where a portion that contacts to the piled unit 10, as shown in FIG. 9.

The elastic member 53 is made of a rubber sheet in the present embodiment.

The pressing member 5 could be a member that the elastic member 53 made of the rubber sheet is stuck on a surface that faces the piled unit 10 of a main member 50 made of a metal plate, for example.

Moreover, the elastic member 53 may be intervened between the main member 50 and the piled unit 10 as another member from the main member 50.

In addition, silicone resin etc. can also be used as the elastic member 53, for example, other than a rubber sheet.

The rest of the composition is the same as that of the first embodiment.

In the present embodiment, the elastic member 53 in the pressing member 5 can also apply the pressurizing force together with the potting material 42 to the piled unit 10.

That is, the elastic force of the potting material 42 and the elastic force of the elastic member 53 in the pressing member 5 are combined in series to the piled unit 10.

Therefore, it is easy to make the spring constant as a whole small.

Therefore, it becomes easy to absorb a dimensional tolerance and thermal expansion of the piled unit 10.

As a result, the composition for pressurizing the piled unit 10 can be simplified as a whole.

Moreover, even when the spring constant of the potting material 42 is large, it becomes easy to respond to the dimensional tolerance and thermal expansion of the piled unit 10 by having a composition that provides the elastic member 53 in the pressing member 5.

Other functions and effects are the same as those of the first embodiment.

Fourth Embodiment

Figure 10:
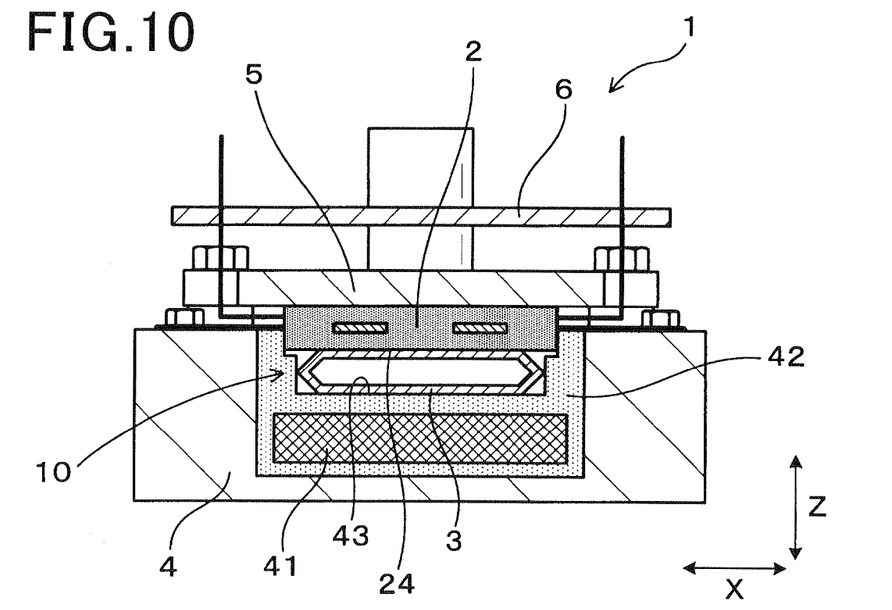
FIG. 10 shows a sectional view of an electric power converter in a fourth embodiment.

The present embodiment is an example that constituted the piled unit 10 with the semiconductor module and the cooling pipe 3 disposed on one side of the semiconductor module 2, as shown in FIG. 10.

That is, the semiconductor module 2 in the present embodiment is one-side-cooling type instead of a double-side-cooling type like the first to third embodiments.

In addition, the cooling pipe 3 is contacting onto a heat radiating surface 24 formed in one of the principal surfaces of the semiconductor module 2.

In the present embodiment, the cooling pipe 3 is contacted to the potting surface 43 of the capacitor module 4, and the semiconductor module 2 is contacted to the pressing member 5.

In this case, the cooling pipe 3 can also perform heat dissipation of the capacitor element 41 effectively.

However, although it becomes disadvantageous from the viewpoint of heat dissipation of the capacitor element through the cooling pipes 3, the order of piling the cooling pipes 3 and the semiconductor module 2 may be reversed.

The rest of the composition is the same as that of the first embodiment.

In the present embodiment, the number of parts of the electric power converter can be reduced more.

Other functions and effects are the same as those of the first embodiment.

Fifth Embodiment

Figure 11:
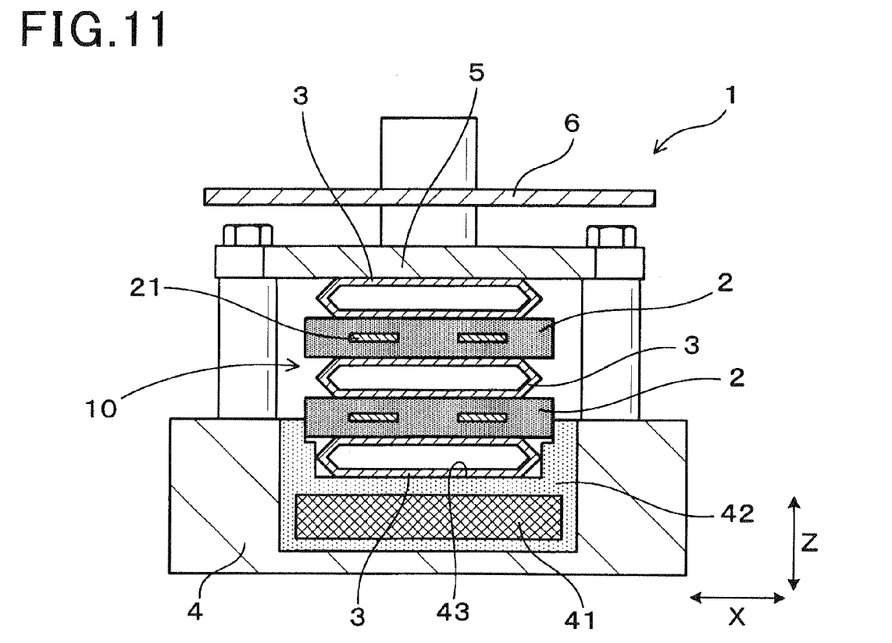
FIG. 11 shows a sectional view of an electric power converter in a fifth embodiment.

The present embodiment is an example that piled two semiconductor modules 2 and three cooling pipes 3 by turns to constitute the piled unit 10, as shown in FIG. 11.

That is, in the present embodiment, the plurality of switching elements 21 that constitute the inverter circuit are distributed and built in the two semiconductor modules 2, for example.

The rest of the composition is the same as that of the first embodiment.

Other functions and effects of the present embodiment are the same as those of the first embodiment.

In addition, the number of stages of the semiconductor module 2 and the cooling pipes 3 in the piled unit 10 is not especially limited, and the semiconductor module 2 may have three or more stages, and the cooler 3 may also have four or more stages, for example.

Sixth Embodiment

Figure 12:
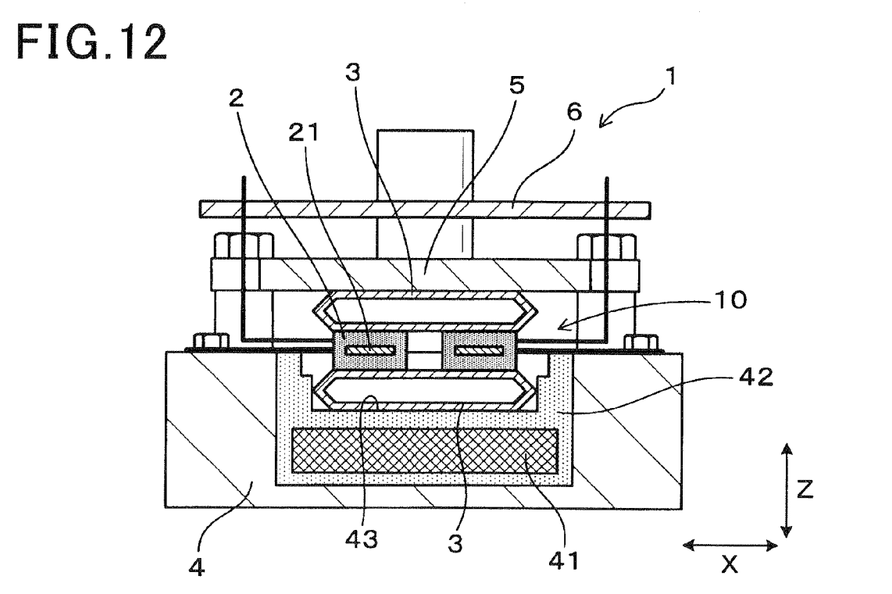
FIG. 12 shows a sectional view of an electric power converter in a sixth embodiment.

The present embodiment is an example that arranges a plurality of semiconductor modules 2 between a pair of cooling pipes 3 disposed in the piling direction Z to constitute the piled unit 10, as shown in FIG. 12.

The rest of the composition is the same as that of the first embodiment.

Other functions and effects of the present embodiment are the same as those of the first embodiment.

Seventh Embodiment

Figure 13:
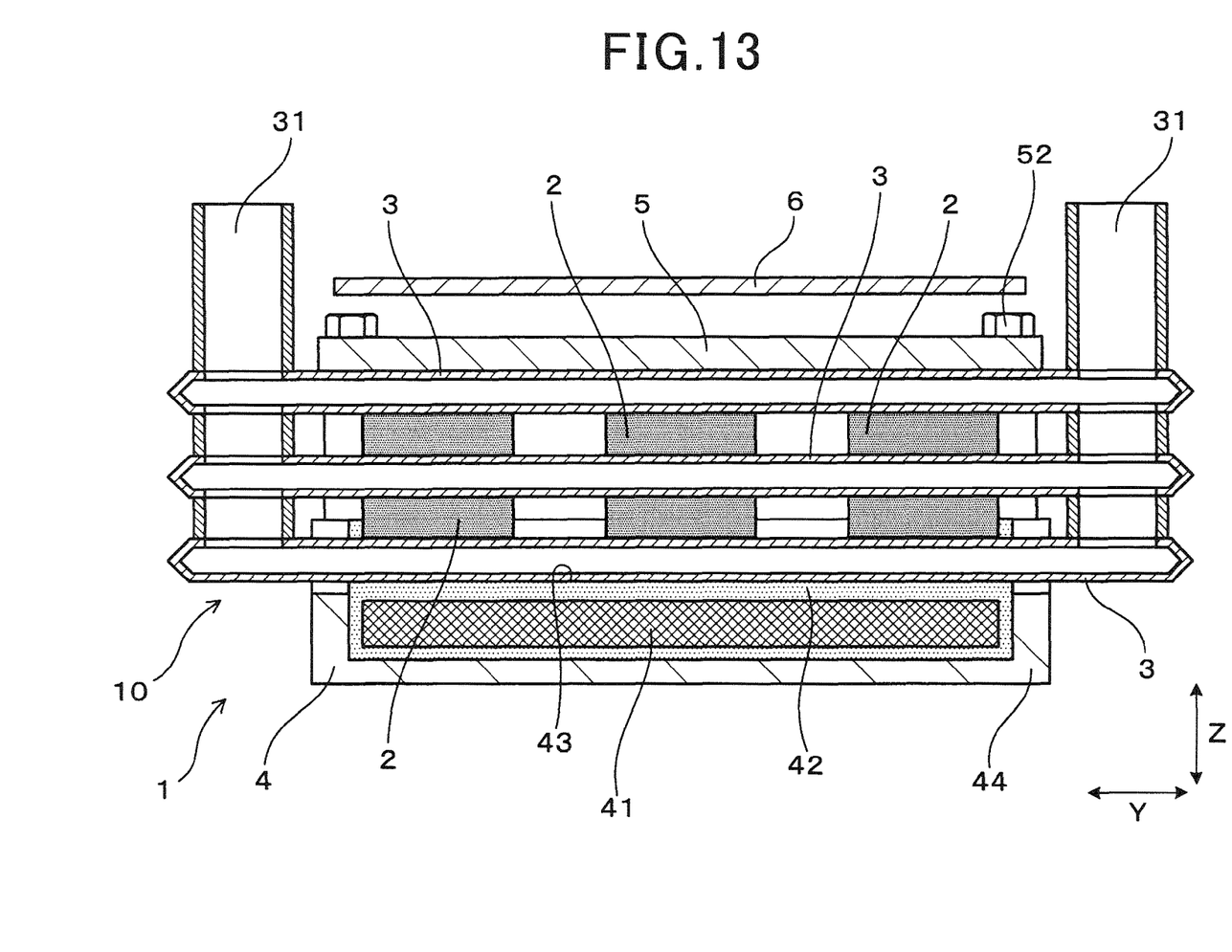
FIG. 13 shows a sectional view of an electric power converter in a seventh embodiment.

The present embodiment is an example that arranges a plurality of semiconductor modules 2 between a pair of cooling pipes 3 disposed in the piling direction Z, and multiple stages of the semiconductor module 2 in the piling direction Z are provided to constitute the piled unit 10, as shown in FIG. 13.

It is the composition that results from combining the fifth embodiment and the sixth embodiment, in other words.

The rest of the composition is the same as that of the first embodiment.

Other functions and effects of the present embodiment are the same as those of the first embodiment.

Although the examples having the first and second guiding sections that position the piled unit to the capacitor module are shown in the embodiments mentioned above, it is also possible to have a composition that does not have the guiding sections.

Moreover, the capacitor module can also have a composition that has no case, for example, and may have a composition that the potting material is exposed over all the circumferences.

What is claimed is:

1. An electric power converter having a semiconductor module that has a switching element therein;
    cooling pipes that contact with heat radiating surfaces of the semiconductor module and cool the semiconductor module; and
    a capacitor module formed by sealing a capacitor element therein by a potting material; comprising:
    a piled unit formed by piling the semiconductor module and the cooling pipes, a direction where the semiconductor module and the cooling pipes are piled is defined as a piling direction, the piled unit is sandwiched between the capacitor module disposed in a first end side in the piling direction of the piled unit and a pressing member disposed in a second end side in the piling direction of the piled unit; and
    the first end of the piled unit is contacted to a potting surface that is a surface of the potting material in the capacitor module.

2. The electric power converter according to claim wherein,
    a press-contacted surface with the pressing member and a press-contacted surface with the potting surface of the piled unit overlap with the switching element in the piling direction.

3. The electric power converter according to claim 2, wherein,
the semiconductor module has a plurality of switching elements therein, and the plurality of switching elements overlap with the press-contacted surface with the pressing member and the press-contacted surface with the potting surface of the piled unit in the piling direction.

4. The electric power converter according to claim 3,
the plurality of switching elements is arranged along a direction that intersects perpendicularly with the piling direction.

5. The electric power converter according to claim 1, wherein,
the semiconductor module has heat radiating surfaces on a pair of principal surfaces, and the cooling pipes are arranged to contact onto both sides of the heat radiating surfaces.

6. The electric power converter according to claim 1, wherein,
each of the cooling pipes has a coolant channel therein where cooling media circulates, and
signal terminals and power terminals disposed in the semiconductor module are projected in a direction that intersects perpendicularly with both a circulating direction of the cooling medium and the piling direction in the cooling pipes.

7. The electric power converter according to claim 1, wherein,
a control circuit board having a control circuit that controls the conductor module is disposed next to the pressing member in a side opposite to the piled unit under the condition where a normal direction of a principal surface of the control circuit board matches the piling direction;
signal terminals disposed in the semiconductor module are connected to the control circuit board; and
the signal terminals are disposed inside the capacitor module and the control circuit board when seen from the piling direction.

8. The electric power converter according to claim 1,
the pressing member is fixed to the capacitor module.

9. The electric power converter according to claim wherein,
the capacitor module has a guiding section that positions the piled unit in a direction that intersects perpendicularly to the piling direction.

10. The electric power converter according to claim 1, wherein,
an elastic member is disposes in the pressing member where at least a portion of the pressing member that contacts to the piled unit.

* * * * *